United States Patent [19]

Stromswold et al.

[11] 4,336,511

[45] Jun. 22, 1982

[54] METHOD AND APPARATUS FOR INCREASING THE SWEEP RATE OF A LINEARLY SWEPT FREQUENCY OSCILLATOR

[75] Inventors: Chester E. Stromswold, Nashua; Robert T. Martel, Derry, both of N.H.; John Apostolos, Malden, Mass.; Robert P. Boland, Nashua, N.H.

[73] Assignee: Sanders Associates, Inc., Nashua, N.H.

[21] Appl. No.: 27,953

[22] Filed: Apr. 9, 1979

[51] Int. Cl.³ .............................................. H03B 23/00
[52] U.S. Cl. ........................................ 331/178; 331/4
[58] Field of Search ..................... 331/178, 4; 328/184; 358/180, 148, 158, 159

[56] References Cited

U.S. PATENT DOCUMENTS

| | | | |
|---|---|---|---|
| 3,382,460 | 5/1968 | Blitz et al. | 331/178 |
| 4,038,612 | 7/1977 | Borofka et al. | 331/4 |
| 4,160,958 | 7/1979 | Mims et al. | 331/178 |

*Primary Examiner*—David K. Moore
*Attorney, Agent, or Firm*—Louis Etlinger; Ronald Reichman

[57] ABSTRACT

The sweep rate of a linearly swept frequency generator is increased while maintaining strict linearity by artificially increasing the number of zero axis crossings of the output signal from a linearly swept voltage controlled oscillator over those that would naturally occur during a linear sweep. This permits an increased sampling rate which, in turn, permits the oscillator sweep rate to be increased without loss of accuracy. Increasing the number of zero axis crossings is accomplished by introducing phase shifts in the output of the oscillator at calculated sampling times with phase shifting being accomplished indirectly by heterodyning the swept oscillator output with the output from a fixed oscillator whose output signal is phase shifted by discrete amounts during the frequency sweep. Only a small number of phase shifts need be introduced due to the discovery of certain symmetries of phase when sweeping through a frequency range.

13 Claims, 8 Drawing Figures

METHOD AND APPARATUS FOR INCREASING THE SWEEP RATE OF A LINEARLY SWEPT FREQUENCY OSCILLATOR

FIELD OF INVENTION

This invention relates to a sweep frequency generator and more particularly, to a generator whose output frequency changes precisely with time in which the sweep rate of the generator is increased without loss of linearity.

BACKGROUND OF THE INVENTION

In the U.S. Pat. No. 3,382,460 entitled "Linearly Swept Frequency Generator" issued to Daniel Blitz and Martin Richmond on May 7, 1968, and incorporated herein by reference, a linearly swept frequency generator is disclosed in which the linearity of the generator is carefully controlled. The generator employs a voltage controlled oscillator which produces an output whose frequency sweeps through a given frequency range. The control voltage is varied so as to vary the frequency of the output signal as a predetermined function of time over the sweep frequency range. In order to obtain strict linearity during that sweep, the phase of the output signal is sampled at intervals as determined by a sampling signal. The sampling intervals are chosen so that the phase of the output signal changes by predetermined increments between successive samplings. Generally, the intervals are selected so that the output signal contains only integral numbers of cycles between successive samplings as its frequency varies at a prescribed rate. This enables the sampling of the phase of the signal during its sweep, in terms of the positive going zero crossover of the output signal, which crossovers are to occur at exactly the sampling time, such that by measuring the amplitude difference from zero at the sampling time, the phase error can be detected and corrected. Thus, any variation in the sampled phase from the norm is detected and is fed back as an error signal to the voltage controlled oscillator to correct the slope, phase and frequency of its output signal.

The system described in the above-mentioned patent is particularly suitable for achieving a controlled linear frequency sweep. In this case, the waveform gains or loses cycles at a constant rate. Therefore, a constant sampling frequency can be utilized to check the phase of the continuously varying generator output frequency. For simplicity, the system is arranged to sample the output signal at positive going zero axis crossings. As long as the average value of the signal during the brief sampling interval is zero, no error signal is fed back to the oscillator. However, if a signal has a leading, or lagging phase this produces a finite average voltage which is used as an error signal to correct the output signal.

As such, the above-mentioned linearly swept generator has applications for receivers arranged for surveillance of a frequency band which employs a linearly swept frequency generator as its local oscillator. In these types of receivers, each received signal is timed from the beginning of the frequency sweep and the length of this interval corresponds to the frequency of the signal. Thus, the frequency of incoming signals may be accurately ascertained. In this application and in many others, the accuracy of the method of frequency measurement depends on the accuracy with which the generator is swept.

It has now become increasingly necessary to sweep a given frequency band of interest at higher rates. Moreover, it has been found, that if the sweep rate can be made fast enough, it is possible not only to detect the presence and frequency of an incoming signal, but also to demodulate the signal simultaneously with its detection. Additionally, with increased frequency sweep rates, if it is impossible to demodulate the signal, at least a certain amount of modulation sorting can be obtained without complete demodulation.

However, one cannot merely increase the sweep rate by using faster clocks and sampling rates. This is because the sampling rate is limited by the requirement for integral numbers of cycles between successive samplings. In general, for the system described above, the sample rate can be no greater than the square root of the sweep rate.

In order to solve the sample rate problems and obtain the requisite linearity, it is a part of the subject invention to introduce phase shifts into the portion of the output signal from the voltage controlled oscillator used in the control loop so as to produce additional positive going zero axis crossings. If this is done accurately, the phase of the rapidly swept signal may be sampled more frequently than would be possible utilizing only integral numbers of cycles between samplings. Thus, for instance, if there is in the course of one ordinary cycle only one axis crossing, by the subject technique, it is possible to artificially produce four axis crossings instead of one. This increases the sample rate by a factor of four and permits more rapid sweeping of the voltage controlled oscillator with the requisite linearity. Alternatively, linear accuracy may be increased at a given sweep rate by increasing the number of axis crossings.

It has been found that due to certain symmetries of phase when sweeping through a frequency range, it takes only a small number of discrete phase shifts to accomplish the result of additional zero axis crossings to permit an increased sample rate.

It will be appreciated that once having introduced the appropriate phase shifts, the phase at the increased sample rate may be utilized for the correction of the voltage controlled oscillator in the same manner as described in the above-mentioned patent.

It is, however, only with extreme difficulty that one can directly change the phase of the voltage controlled oscillator output so as to effect additional numbers of zero axis crossings at calculated points in time. It is therefore a portion of this invention to introduce the phase changes which are necessary to effect the zero axis crossings by heterodyning the voltage controlled oscillator output with signals having a number of different waveforms switched in during the sweep. In order to generate signals with these waveforms, the output of a fixed oscillator is phase shifted by discrete amounts during the sweep. This causes the downshifted signal to produce the requisite zero axis crossings and is accomplished in one embodiment by successively delaying the output of the fixed oscillator by fixed amounts during the sweep and by connecting the output of these delay lines to the heterodyning network during the sweep of the voltage controlled oscillator. The switching is controlled by the same sweep timing that controls a ramp generator which, in turn, controls the voltage controlled oscillator. Thus, in synchronism with the sweep, successive discretely delayed fixed oscillator outputs are switched in to be heterodyned with the output of the voltage controlled oscillator. Amplitudes representing variations from zero phase at the calculated zero axis crossing points are measured in the same manner as in the above-mentioned patent and are utilized to effect instantaneous control of the voltage controlled oscillator.

It is a feature of this invention that it is possible to use only a small number of phase shifts or delays. This is because of the discovery of certain symmetries of phase, when sweeping through a given frequency range. A mathematical treatment of how the phase shifts and thus, the delays, are chosen follows in the detailed description of the invention.

It, therefore, is an object of this invention to provide an improved linearly swept frequency generator;

It is another object of this invention to provide a linearly swept frequency generator whose sweep rate may be increased due to the provision of an error detection and feedback circuit which utilizes an increased sample rate, thereby to permit correction of the output of the voltage controlled oscillator even when the oscillator is operated at higher sweep rates;

It is a still further object of this invention to provide a method for increasing the sweep rate of a frequency generator while still maintaining the linearity of the sweep.

These and other objects of the invention will be better understood in connection with the appended drawings taken in connection with the following detaild description wherein.

DETAILED DESCRIPTION

As will be appreciated, if the subject system is to be used with compressive receivers which, in general, utilize compressive filters that delay input signals as a precise linear function of frequency, then it is important that the linearity of the voltage controlled oscillator which produces the sweep be exceptionally accurate so as to match the frequency versus delay characteristic of the compressive delay line. While the linearly swept frequency generator of U.S. Pat. No. 3,382,460 adequately estabilshes linearity for certain compressive receivers, for the reasons stated above, it is important that the sweep rate of the compressive receiver be increased while maintaining the same degree of linearity.

Figure 1:
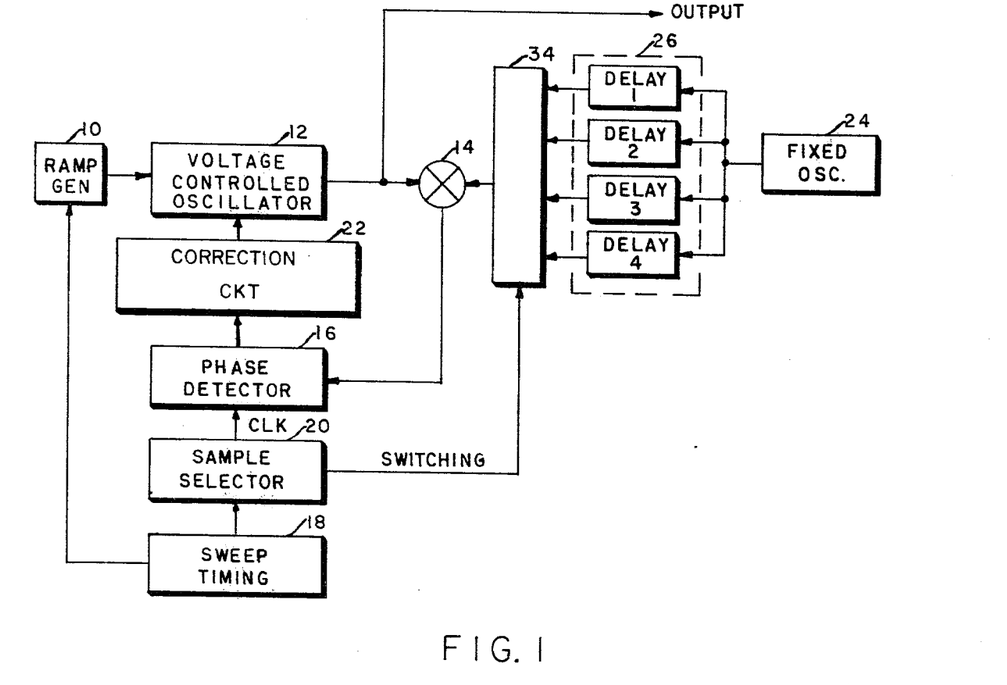
FIG. 1 is a block diagram of the subject system illustrating the sequential switching of predetermined delays into the output of a fixed oscillator which is then heterodyned with a voltage controlled oscillator output.

In order to accomplish this, it is necessary to synthetically generate positive axis crossings so that the linearity of the signal from the voltage controlled oscillator may be checked more rapidly than was heretofore possible when utilizing whole numbers of cycles. As in the prior mentioned patent, in its simplest form, a linear sweep frequency generator embodying the invention comprises a ramp generator 10 whose output is fed to a voltage controlled oscillator 12 to sweep its frequency approximately linearly with respect to time in the usual way. A portion of the output of oscillator 12, is coupled to a heterodyning circuit 14, with the heterodyning circuit output being coupled to a phase detector 16. It is this portion that is used in a feedback loop to control oscillator linearity. Note that the swept signal from the oscillator is tapped off prior to the heterodyning stage.

Phase detector 16 is turned on periodically by a signal from a sweep timing circuit 18 which is passed through a sample selector 20 which detects the occurrence of a sample pulse from the sweep timing unit. For the phase detector, this sample pulse is used directly to turn on the phase detector. As will be described, sample selector 20 also controls a switching circuit.

Each time phase detector 16 is pulsed on, it delivers an error signal which is indicative of the instantaneous phase of oscillator 12 at that moment. This error signal is fed to a correction circuit 22 and there is processed to produce a phase correction signal for oscillator 12. How this is accomplished is fully described in the aforementiond Blitz and Richmond patent and will not be described here in detail.

As mentioned hereinbefore, it is a purpose of the subject invention to provide synthetic positive axis crossings for the output of the voltage controlled oscillator so that the phase of the signal from the oscillator may be sampled more frequently than would ordinarily be possible.

This is accomplished by utilizing a fixed oscillator 24, the output of which is applied to a delay unit 26. As will be seen hereinafter, in order to obtain the requisite waveform, only a minimum number of delays need be provided for the output of the fixed oscillator.

The output of delay unit 26 is applied to a switching unit 34 which, on the occurrence of a sample pulse, switches the output of the delay unit to heterodyning circuit 14 so as to produce a downshifted signal in which the aforementioned zero axis crossings are artificially produced. Switching unit 34 is under control of sample selector 20 such that, in one embodiment, midway between sampling pulses, the output of a particular delay line is switched to the heterodyning circuit.

In one operative embodiment, voltage controlld oscillator 12 sweeps from 2050 MHz to 2550 MHz at a rate of 10 MHz/microsecond. This compares to a rate of only 800 Hz/microsecond for the early Blitz/Richmond linearity swept oscillators. In this embodiment the fixed oscillator has a frequency of 2000 MHz, with the downshifted range being 50 MHz–550 MHz.

Figure 2A:
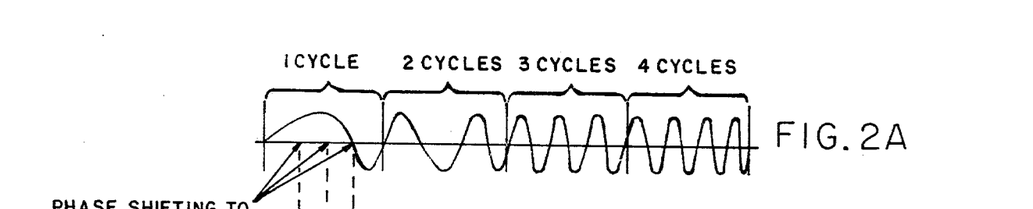
FIGS. 2A and 2B are waveform diagrams indicating the sweep frequency output of the voltage controlled oscillator of FIG. 1 indicating positive going zero axis crossings for an original sample rate and showing the positions where positive going axis crossings must be produced in order to increase the sample rate by a factor of 4.
Figure 2B:
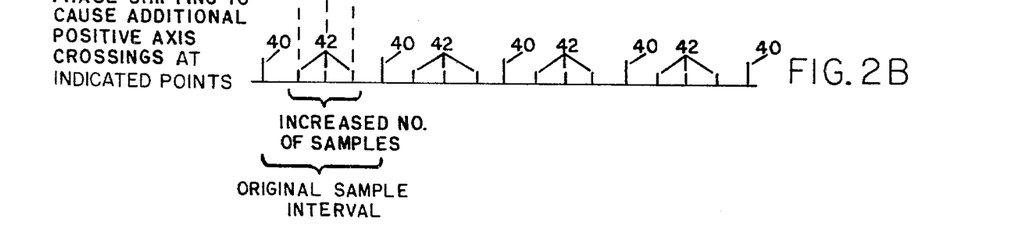

As seen in FIGS. 2A and 2B, the purpose of the heterodyning circuit is to artificially produce zero axis crossings at an increased number of sample times. Referring to FIG. 2A, under ordinary circumstances when utilizing integral numbers of cycles, it is possible to have a uniform sample clock which produces pulses as illustrated by tickmarks 40. As can be seen, integral numbers of cycles are necessary in order to have a positive axis crossing at the appropriate sampling time. Any deviation of the actual signal from zero at these sample times is utilized for the correction of the voltage controlled oscillator. In order to increase the number of samples, it is therefore necessary to artificially produce zero axis crossings of the output signal from the voltage controlled oscillator. This is done in the subject invention by phase shifting the output signal of the voltage controlled oscillator.

Figure 3:
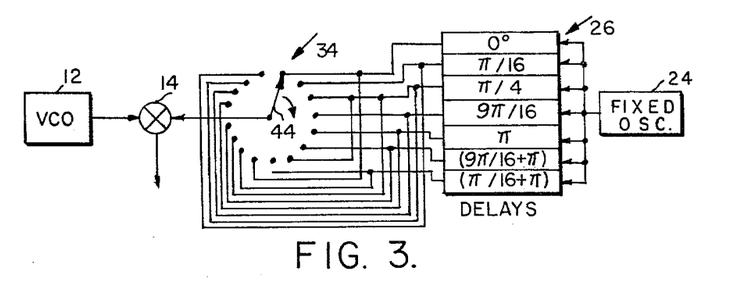
FIG. 3 is a schematic block diagram of a switching system for switching in predetermined delays in the output of the fixed oscillator.

As mentioned hereinbefore, if additional samplings are to be made at the times illustrated by tickmarks 42, one way of indirectly providing the appropriate phase shifts is to heterodyne the output signal from the voltage controlled oscillator with signals having various waveforms. It has been found through mathematical analysis to be provided hereinafter that it is possible to obtain the requisite increase in sampling rates by delays which reoccur in a periodic manner during the sweep of the oscillator. In one operative embodiment, these delays are: 0; $\pi/16$; $\pi/4$; $9\pi/16$; $\pi$; $(9\pi/16+\pi)$; $(\pi/16+\pi)$. By tapping the outputs of delay lines providing these delays with a rotary switch 44 as illustrated, it is possible to provide the aforementioned positive axis crossing at the appropriate sample time. Any deviation from zero indicates a deviation in linearity of the voltage controlled oscillator which is sensed and utilized to correct the oscillator.

Figure 4:
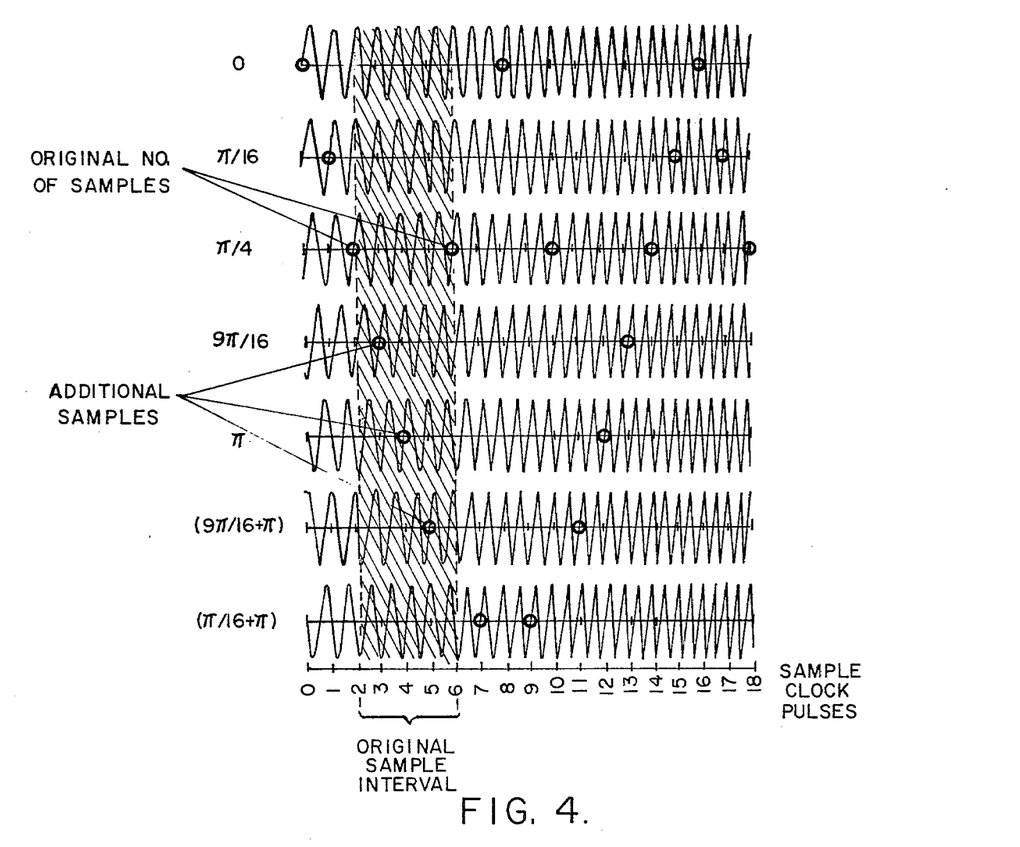
FIG. 4 illustrates a number of signals having the illustrated waveforms which are produced by heterodyning the delayed fixed oscillator outputs with the swept output of the voltage controlled oscillator, with the switching of selected waveforms at predetermined times resulting in positive axis crossings at regular intervals corresponding to the increased sample rate.

Referring to FIG. 4, output signals from heterocyning circuit 14 are illustrated for a sweep of the voltage controlled oscillator in which the sweep output is heterodyned with signals from the fixed oscillator which have been delayed by the indicated amounts. As can be seen, positive going axis crossings are available for each of the sample clock pulses. These axis crossings are illustrated by the heavy circles and can be established by merely ascertaining which of the waveforms has a zero axis crossing at a particular sample clock pulse. What will be seen is that there is a recurring pattern which is established throughout the sweep of the voltage controlled oscillator, making possible the artificial production of zero axis crossings by what amounts to the use of a simple rotary switching technique.

More specifically, with respect to FIG. 4, will be appreciated that for sample pulse 0, there is a zero axis crossing for the voltage controlled oscillator output heterodyned with the fixed oscillator signal which is not delayed. At sample pulse #1 the waveform which has the positive going zero axis crossing is the $\pi/16$ waveform. For sample pulse #2 it is the $\pi/4$ waveform which, when heterodyned with the VCO signal, produces a positive axis crossing at the #2 sample pulse. For sample pulse #3 it is the $5\pi/16$ waveform; for sample pulse #4 it is the $\pi$ waveform; for sample pulse #5 it is the $(9\pi/16+\pi)$ waveform; for sample pulse #6 it is the $\pi/4$ waveform; for sample pulse #7 it is the $(\pi/16+\pi)$ waveform; and for sample pulse #8 it is the 0 or undelayed waveform. This pattern repeats in inverse form for the next eight pulses as illustrated.

In the above illustration, it can be seen that the $\pi/4$ waveform has the most number of positive axis crossings available for sampling. This waveform is equivalent in numbers of positive axis crossings available from the output of the voltage controlled oscillator, without any artificially produced phase shifts. Thus, the original sample interval such as illustrated at the bottom of FIG. 4 indicates where the samples would ordinarily be taken. The additional samples are as illustrated, such that three more additional samples are provided. Thus, the sample rate is increased by four which enables the increasing of the sweep rate of the voltage controlled oscillator without loss of accuracy.

Figure 5:
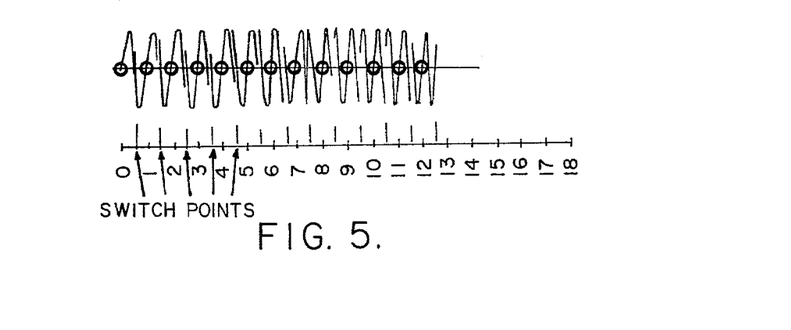
FIG. 5 is the composite waveform generated at the output of the heterodyning circuit showing the occurrence of positive axis crossings at the appropriate sampling times.

Referring to FIG. 5, a composite diagram of the resultant signal is shown. This is the output produced by heterodyning the voltage controlled oscillator signal with the switched signals from the fixed oscillator. The switching is so arranged that switch 44 moves from one point to the next at a time midway between the generation of sample clock pulses.

What has been accomplished is the artificial shifting of the phase of the output from the voltage controlled oscillator so that, assuming exact linearity of the voltage controlled oscillator, there would be a positive axis crossing at the increased sample rate. Any deviation from linearity would result in a non-zero sample being taken which may be applied to correct the output of the voltage controlled oscillator.

A mathematical analysis of the symmetry and repetition in the sampled linearity swept waveform is now presented.

SYMMETRY AND REPETITION IN THE SAMPLED LINEARLY SWEPT WAVEFORM

A linear chirp can be expressed mathematically as:

$$\sin(\omega_0 t + \pi\kappa t^2) = \sin\theta.$$

The phase contains a linear term where $\omega_0$ is the initial frequency from which the sweep begins and a quadratic term where $\kappa$ is the constant rate of change of frequency during the sweep of $\Delta f/\Delta t$ in hertz/sec.

One can sample this waveform at points $t = nT_s$
where n is an integer and $T_s$ is the sampling interval and obtain for the phase samples:

$$\theta_s = \omega_0 n T_s + \pi\kappa(nT_s)^2$$

where $\theta_s$ is the sampled phase. Here n is integer # of the sample.

Assume that before the coherently timed beginning of the linear sweep the oscillator is locked to the sampling frequency $f_s = 1/T_s$. In order for this to be true, $T_s = 2\pi r_s/\omega_0$ where $r_s$ is an integer. Making this substitution into the linear phase part of the expression for the sampled phase:

$$\theta_s = \omega_0 n 2\pi r_s/\omega_0 + \pi\kappa(nT_s)^2$$

$$\theta_s = 2\pi r_s n + \pi\kappa(nT_s)^2 = \pi\kappa(nT_s)^2$$

Now $T_s$ is defined in terms of the sweep rate $\kappa$:

$$T_s = \frac{1}{\sqrt{N}\sqrt{\kappa}}$$

Here N is an integer representing the number of samples n before the samples n repeat.

We make the substitution into the expression for sampled phase and obtain:

$$\theta_s = \pi n^2/N.$$

If we examine certain of these samples separated by N, $$(\pi/N(n+mN))^2 = \pi/Nn^2 + 2\pi mn + m^2\pi N,$$

Here m is an integer.
We find that the function repeats every N values for N even, and every 2N for N odd. Also, the frequency:

$$d\theta_s/dn = 2\pi n/N = 2\pi(n+mN)/N$$

is indistinguishable from a frequency separated from it by a multiple of $2\pi$ which occurs every N values of n. In the original system described in the Blitz/Richmond patent, N=1. That is $T_s = 1/\sqrt{\kappa}$. Therefore, the sample rate for arbitrary N is $\sqrt{N}$ greater than possible in the original system. With N=1, there are two distinct values of the phase samples: 0, $\pi$. The Blitz/Richmond system uses the so called "frequency kick" to make all N=1 phase samples equal to 0. In addition to the repetition in phase samples every N, there is mirror symmetry about N/2. Mathematically:

$$\theta = \frac{\pi\left(\frac{N}{2} \pm m\right)^2}{N} = \frac{\pi N}{4} \pm \pi m + \frac{\pi m^2}{N} \quad N \text{ even}$$

since $\pi m = -\pi m$ for m an integer the phase values are symmetrical. For N odd m is constrained to not being an integer, and corresponding samples either side of N/2 are $\pi$ out of phase. There is also more generalized symmetry in the phase values of the linear sweep:

$$\theta(m) = \frac{\pi}{N}\left(\frac{N}{l} + m\right)^2 = \frac{\pi N}{l^2} + \frac{2\pi m}{l} + \frac{\pi m^2}{N}$$

$$\theta(m) = \theta(-m) \quad m = \frac{rl}{2} \quad l \text{ even} \quad N \text{ a multiple of } l$$

$$m = rl \quad l \text{ odd} \quad r \text{ an integer}$$

$$\theta(m) = \pi + \theta(-m) \quad m = (r - \tfrac{1}{2})\frac{l}{2} \quad l \text{ even}$$

This is by no means an exhaustive list of the symmetries in the phase samples but the ones which are used in the specific implementation have been described. The larger and more composite a number N is, the more usable symmetry is observed. A power of two is the best choice if this is possible.

The fact that the phase samples repeat, and have relatively few different values due to the symmetries, allow us to employ switched phase compensation to increase the sample rate.

This implementation chooses N=16 for a $\sqrt{N}=4$ increase in the sampling rate. N is even and divisible by 4. Therefore, there is symmetry about N/2 and N/4 as shown in Table I.

TABLE I

PHASE SAMPLES OF A LINEARLY SWEPT WAVEFORM $$\left(\theta_s = \frac{\pi n^2}{16}\right)$$

| n | $\theta_s(n)$ | SYMMETRY around N/2 | around N/4 |
|---|---|---|---|
| 0 | 0 | | |
| 1 | $\pi/16$ | | |
| 2 | $\pi/4$ | | |
| 3 | $9\pi/16$ | | |
| 4 | $\pi$ | | |
| 5 | $25\pi/16$ | | $= \theta_s(3) + \pi$ |
| 6 | $\pi/4$ | | $= \theta_s(2)$ |
| 7 | $17\pi/16$ | | $= \theta_s(1) + \pi$ |
| 8 | 0 | | $= \theta_s(0)$ |
| 9 | $17\pi/16$ | $= \theta_s(7)$ | etc. |
| 10 | $\pi/4$ | $= \theta_s(6)$ | |
| 11 | $25\pi/16$ | $= \theta_s(5)$ | |
| 12 | $\pi$ | $= \theta_s(4)$ | |
| 13 | $9\pi/16$ | etc. | |
| 14 | $\pi/4$ | | |
| 15 | $\pi/16$ | | |
| 16 | 0 | | |
| 17 | $\pi/16$ | | |
| 18 | $\pi/4$ | | |

PATTERN REPEATS EVERY 16 SAMPLES

The following is an alternative way to describe an increase in sample rate due to use of phase compensation. The above derivation is with reference to a sample interval $T_s = 1/\sqrt{N\kappa}$. Equivalently, the sample frequency is $\sqrt{N}$ times greater than the Blitz/Richmond system. Thus, the lowest reset frequency that is locked before the start of sweep is required to be $\sqrt{N}$ times greater than the lowest possible such frequency conventionally. This is not a problem in most cases.

Figure 6:
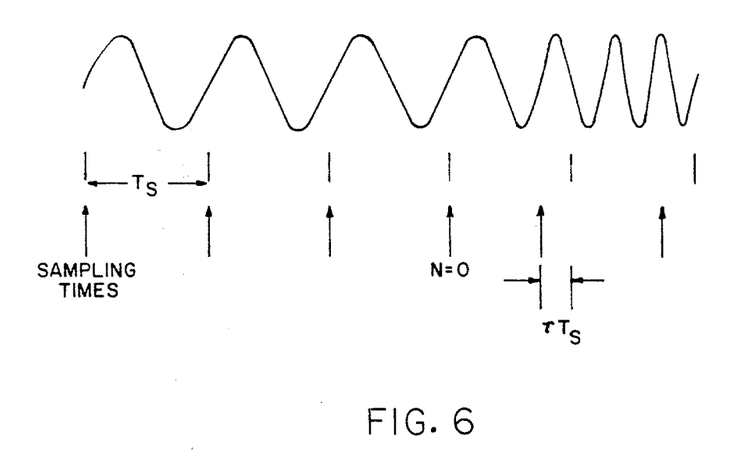
FIG. 6 is a waveform diagram illustrating an alternative explanation of the phenomena which enable increasing the sample clock rate.

It is possible to envision the increase of sample rate as accomplished by the insertion of offset samples at fractional parts of $T_s$. Referring to FIG. 6, samples may be conceived of as being taken at positive zero crossings of the reset frequency before the start of the sweep. After the sweep begins, instead of sampling at intervals of $T_s$, an offset sample is taken at time $t = nT_s - \tau T_s$. A superposition of sets of samples each with a different offset $\tau$ can be determined to increase the sample rate by some factor. To gain a four-fold increase in sample rate, four sample trains with different offsets may be superposed. Table II is a list of phase samples taken at intervals of $T_s/4$.

TABLE II

PHASE VALUES FOR OFFSET SAMPLES OF LINEARLY SWEPT WAVEFORM $$\left(\theta = \pi\frac{t^2}{N} + \omega_0 t\right)$$

| t | (N = 1) $\pi t^2$ | | ($\omega_0 = 2\pi$) $\omega_0 t$ | | ($T_s$ = 1) $\theta_s$ |
|---|---|---|---|---|---|
| 0 | 0 | | 0 | = | 0 |
| 1/4 | $\pi/16$ | + | $\pi/2$ | = | $9\pi/16$ |
| 1/2 | $\pi/4$ | + | $\pi$ | = | $5\pi/4$ |
| 3/4 | $9\pi/16$ | + | $3\pi/2$ | = | $\pi/16$ |
| 1 | $\pi$ | + | 0 | = | $\pi$ |
| 5/4 | $25\pi/16$ | + | $\pi/2$ | = | $\pi/16$ |
| 3/2 | $\pi/4$ | + | $\pi$ | = | $5\pi/4$ |
| 7/4 | $17\pi/16$ | + | $3\pi/2$ | = | $9\pi/16$ |
| 2 | 0 | + | 0 | = | 0 |
| 9/4 | $17\pi/16$ | + | $\pi/2$ | = | $25\pi/16$ |
| 5/2 | $\pi/4$ | + | $\pi$ | = | $5\pi/4$ |
| 11/4 | $25\pi/16$ | + | $3\pi/2$ | = | $17\pi/4$ |
| 3 | $\pi$ | + | 0 | = | $\pi$ |

TABLE II-continued
PHASE VALUES FOR OFFSET SAMPLES OF
LINEARLY SWEPT WAVEFORM $$\left(\theta = \pi \frac{t^2}{N} + \omega_0 t\right)$$

| t | (N = 1) $\pi t^2$ | | ($\omega_0 = 2\pi$) $\omega_0 t$ | | ($T_s$ = 1) $\theta_s$ |
|---|---|---|---|---|---|
| 13/4 | $9\pi/16$ | + | $\pi/2$ | = | $17\pi/16$ |
| 7/2 | $\pi/4$ | + | $\pi$ | = | $5\pi/4$ |
| 15/4 | $\pi/16$ | + | $3\pi/2$ | = | $25\pi/16$ |

The only difference between this and Table I consists of the phase constrictions from the samples of the starting frequency which were 0 in Table I. There is repetition every 16 samples and symmetry around $t=1$ and $t=3$. Note: in certain circumstances $$\tau = -\frac{k}{4} + 1$$

$$= 0, \tfrac{1}{4}, \tfrac{1}{2}, \tfrac{3}{4}$$

The hardware required is identical to the hardware in FIG. 1 with the exception of the value of the phase shifts involved.

NUMBER OF DELAY LINES

In summary, there is repetition of phase samples every N for N an even number and every 2 N for N an odd number. This is shown by the equations:

$$\theta(n) = \pi n^2/N$$

$$\theta(n+mN) = \pi/Nn^2 + 2\pi mn + m^2\pi N$$

At the very least this means that for N even, the number of delay lines necessary will be less than N/2. Where N is an even integer representing the number of samples n before the phase sampling n repeat. For various values of N, the number of delay lines will be much less than N/2. Note, in the above equations the second term is always a multiple of $2\pi$ so it is insignificant. The third term will be a multiple of $2\pi$ for any integer value of m if N is even. However, if N is odd, then only even values of m cause the third term to drop out.

For even values of N there is mirror symmetry about N/2. We can show this by writing:

$$\theta\left(\frac{N}{2} \pm m\right) = \frac{\pi\left(\frac{N}{2} \pm m\right)}{N} = \frac{\pi N}{4} \pm \pi m + \frac{\pi m^2}{N}$$

N is even

Since for m equal to any value $+\pi m = -\pi m$, we see that for N even the number of different phase values is less than N/2. When N is odd m in the above expression cannot be an integer since N/2 isn't an integer. In this case, corresponding samples either side of N/2 are $\pi$ out of phase.

As N becomes a larger, more composite number other symmetries appear which further reduce the number of phase delays required. Only symmetries which produce samples of the same phase or samples separated in phase by $\pi$ are considered immediately useful. If the samples are the same, the same delay line can be used for both cases. When the samples differ by $\pi$, an inversion is required to use the same delay line. Suppose that N is a multiple of l $$\theta(m) = \pi/n(N/l+m)^2 = \pi N/l^2 + 2\pi m/l + \pi m^2/l$$

and $$\theta(m) = \theta(-m) \text{ for } m = \frac{rl}{2} \text{ and } l \text{ even}$$

for $m = rl$ when $l$ is odd, and $r$ can be any integer.

$$\theta(m) = \pi + \theta(-m) \text{ for } m = (r - \tfrac{1}{2})\frac{l}{2}$$

if $l$ is even and divisible by 4.

This type of symmetry means that phase samples will repeat or differ by $\pi$ (an inversion) for various steps on either side of N/l. This will further reduce the number of phase delays needed.

FREQUENCY OFFSET

The "frequency kick" employed in the Blitz/Richmond type device to provide samples always on the same direction zero crossing can be generalized into a method of using offset fixed local oscillators to provide increased sampling rates.

Before the sweep:

$$\theta_I = \omega_0 t$$

As the sweep begins, a frequency offset is introduced:

$$\omega = \omega_0 + \delta$$

$$\theta_s = \omega_0 nT_s + \delta nT_s + \pi\kappa(nT_s)^2$$

$$= \delta nT_s + \pi\kappa(nT_s)^2 \quad T_s = 2\pi r_s/\omega_0 = 1/\sqrt{N\kappa}$$

Making the substitution:

$$\delta T_s = \alpha\pi$$

$$\theta_s = \pi(n^2/N + \alpha n)$$

In the Blitz/Richmond device the parameter $\alpha = 1$. Since N=1 in that case and 1 is an odd number, the samples of the sweep without a frequency offset are not identical but instead alternate between 0 and $\pi$. When the frequency offset is chosen, $\delta T_s = \pi$, each sample becomes 0. For other values of N, the parameter can be chosen for various effects but primarily so that samples of the frequency offset chirp will repeat the same phase more often than the non-offset case. So, it is required that the phase is the same every N/l samples (N/l is an integer).

$$\theta(m) = \frac{\pi}{N}\left(n + \frac{mN}{l}\right)^2 + \pi\alpha\left(n + \frac{mN}{l}\right) \quad m \text{ is an integer}$$

$$\theta(m + 1) - \theta(m) = \frac{2\pi n}{l} + \frac{2\pi mN}{l^2} + \frac{\pi N}{l^2} + \frac{\pi\alpha N}{l} = 2\pi k$$

$k$ is an integer

The phase difference must be a multiple of $2\pi$ regardless of m. For this to be true, m must be a multiple of $l^2/N$, or, since m can be any integer, N is a multiple of $l^2$. The variable n is the number of the sample at which the repetition starts. For convenience, it is usually given in the range $0 \leq n < N/l$.

$$\alpha = \frac{2kl}{N} - \frac{1}{l} - \frac{2n}{N} \quad N = rl^2 \quad r \text{ is an integer}$$

The frequency offset is then:

$$\delta = \alpha \pi f_s \quad f_s = 1/T_s$$

For N=16 as given in the previous example, there are 2 choices of l: 4 and 2

$$\alpha_4 = \frac{k}{2} - \frac{1}{4} - \frac{n}{8} \quad k \text{ is any integer}$$

$$\alpha_2 = \frac{k}{4} - \frac{1}{2} - \frac{n}{8}$$

Tables III and IV indicate the effects of these choices of $\alpha$.

TABLE III

SAMPLES OF FREQUENCY OFFSET LINEARLY SWEPT WAVEFORM

(l = 4) $\quad \left\{ \theta_s = \pi \left( \frac{n^2}{16} + \alpha n \right) \right\} \quad \left( \alpha_4 = \frac{k}{2} - \frac{1}{4} - \frac{n}{8} \right)$

| n | $\theta_s$ $\alpha=0$ | $\alpha = \frac{1}{4}$ | $\alpha = \frac{1}{4}, \frac{3}{4}, \frac{5}{4} \ldots$ n = 0 | $\alpha = \frac{1}{8}, \frac{5}{8}, \frac{9}{8} \ldots$ n = 1 | $\alpha = 0, \frac{1}{2} \ldots$ n = 2 | $\alpha = \frac{3}{8} \ldots$ n = 3 |
|---|---|---|---|---|---|---|
| 0 | 0 | 0 | 0 | | | |
| 1 | $\pi/16$ | $5\pi/16$ | | $\frac{3\pi}{16}, \frac{11\pi}{16}, \frac{19\pi}{16}$ | | |
| 2 | $\pi/4$ | $12\pi/16$ | | | $\pi/4, 5\pi/4$ | |
| 3 | $9\pi/16$ | $21\pi/16$ | | | | $27\pi/16$ |
| 4 | $\pi$ | 0 | 0 | | | |
| 5 | $25\pi/16$ | $13\pi/16$ | | $\frac{3\pi}{16}, \frac{11\pi}{16}, \frac{19\pi}{16}$ | | |
| 6 | $\pi/4$ | $28\pi/16$ | | | $\pi/4, 5\pi/4$ | |
| 7 | $17\pi/16$ | $13\pi/16$ | | | | $27\pi/16$ |
| 8 | 0 | 0 | 0 | | | |
| 9 | $17\pi/16$ | $21\pi/16$ | | $\frac{3\pi}{16}, \frac{11\pi}{16}, \frac{19\pi}{16}$ | | |
| 10 | $\pi/4$ | $12\pi/16$ | | | $\pi/4, 5\pi/4$ | |
| 11 | $25\pi/16$ | $5\pi/16$ | | | | $27\pi/16$ |
| 12 | 0 | 0 | 0 | | | |
| 13 | $9\pi/16$ | $29\pi/16$ | | $\frac{3\pi}{16}, \frac{11\pi}{16}, \frac{19\pi}{16}$ | | |
| 14 | $\pi/4$ | $28\pi/16$ | | | $\pi/4, 5\pi/4$ | |
| 15 | $\pi/16$ | $29\pi/16$ | | | | $27\pi/16$ |

TABLE IV

SAMPLES OF FREQUENCY OFFSET LINEARLY SWEPT WAVEFORM

(l = 2) $\quad \left\{ \theta_s = \pi \left( \frac{n^2}{16} + \alpha n \right) \right\} \quad \left( \alpha_2 = \frac{k}{4} - \frac{1}{2} - \frac{n}{8} \right)$

| n | $\theta_s$ $\alpha=0$ | $\alpha = \frac{1}{8}$ | $\alpha = 0$ n = 0 | $\alpha = \frac{1}{8}$ n = 1 | $\alpha = 0$ n = 2 | $\alpha = \frac{1}{8}$ n = 3 | $\alpha = 0$ n = 4 | $\alpha = \frac{1}{8}$ n = 5 | $\alpha = 0$ n = 6 | $\alpha = \frac{1}{8}$ n = 7 |
|---|---|---|---|---|---|---|---|---|---|---|
| 0 | 0 | 0 | 0 | | | | | | | |
| 1 | $\pi/16$ | $3\pi/16$ | | $\frac{3\pi}{16}$ | | | | | | |
| 2 | $\pi/4$ | $\pi/2$ | | | $\frac{\pi}{4}$ | | | | | |
| 3 | $9\pi/16$ | $15\pi/16$ | | | | $\frac{15\pi}{16}$ | | | | |
| 4 | $\pi$ | $3\pi/2$ | | | | | $\pi$ | | | |
| 5 | $25\pi/16$ | $3\pi/16$ | | | | | | $\frac{3\pi}{16}$ | | |
| 6 | $\pi/4$ | $\pi$ | | | | | | | $\frac{\pi}{4}$ | |
| 7 | $17\pi/16$ | $31\pi/16$ | | | | | | | | $\frac{31\pi}{16}$ |
| 8 | 0 | $\pi$ | 0 | | | | | | | |
| 9 | $17\pi/16$ | $3\pi/16$ | | $\frac{3\pi}{16}$ | | | | | | |
| 10 | $\pi/4$ | $3\pi/2$ | | | $\frac{\pi}{4}$ | | | | | |
| 11 | $25\pi/16$ | $15\pi/16$ | | | | $\frac{15\pi}{16}$ | | | | |
| 12 | $\pi$ | $\pi/2$ | | | | | $\pi$ | | | |
| 13 | $9\pi/16$ | $3\pi/16$ | | | | | | $\frac{3\pi}{16}$ | | |

TABLE IV-continued
SAMPLES OF FREQUENCY OFFSET LINEARLY SWEPT WAVEFORM $(l = 2)$ $\left\{ \theta_s = \pi\left(\frac{n^2}{16} + \alpha n\right) \right\}$  $\left( \alpha_2 = \frac{k}{4} - \frac{1}{4} - \frac{n}{8} \right)$

| n | $\theta_s$ $\alpha = 0$ $n = 0$ | $\alpha = \frac{1}{8}$ | $\alpha = 0$ $n = 0$ | $\alpha = \frac{1}{8}$ $n = 1$ | $\alpha = 0$ $n = 2$ | $\alpha = \frac{1}{8}$ $n = 3$ | $\alpha = 0$ $n = 4$ | $\alpha = \frac{1}{8}$ $n = 5$ | $\alpha = 0$ $n = 6$ | $\alpha = \frac{1}{8}$ $n = 7$ |
|---|---|---|---|---|---|---|---|---|---|---|
| 14 | $\pi/4$ | 0 | | | | | | | $\frac{\pi}{4}$ | |
| 15 | $\pi/16$ | $31\pi/16$ | | | | | | | | $\frac{31\pi}{16}$ |

Notice that the frequency offset causes a change in the points of symmetry in the phase samples. For $\alpha = \frac{1}{4}$, there is symmetry around $n = 6$ and $n = 14$. If $\alpha = \frac{1}{8}$, the symmetry is around $n = 7$ and $n = 15$. The $\alpha$ which produces symmetry around a given sample point, n, is given by:

$$\alpha = k - (2n/N) \text{ where k is an integer}$$

Figure 7:
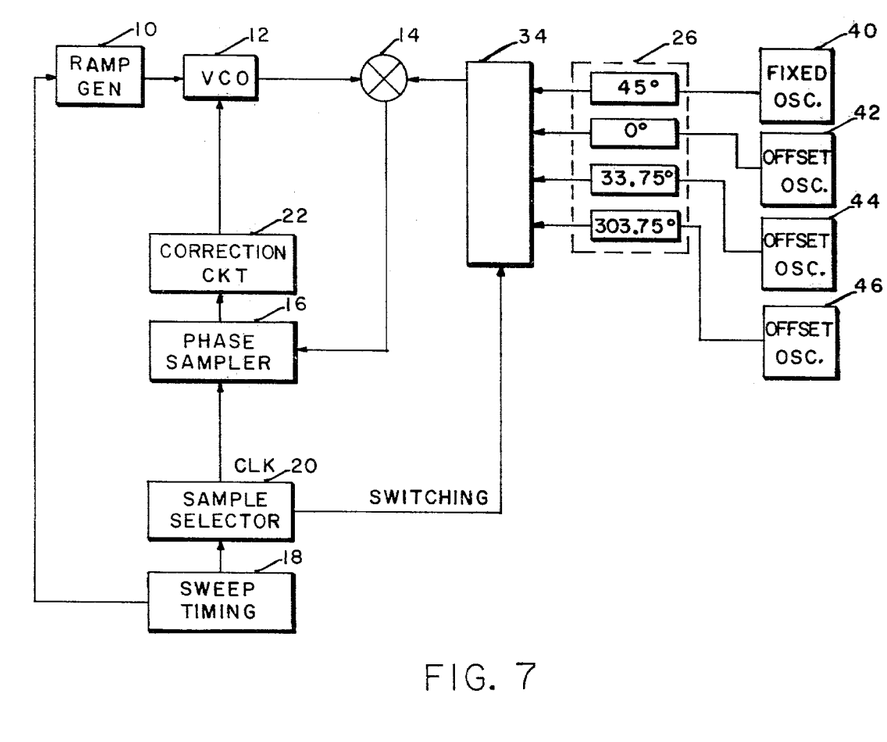
FIG. 7 is a schematic and block diagram of a frequency offset embodiment.

FIG. 7 is a block diagram of a loop with a four-fold increase in sample rate. This corresponds to Table III. Note the use of 4 offset local oscillators and phase compensation associated with each. The phase compensation is needed since the samples that repeat are not at zero crossings. The offset oscillators must of course be phase coherent.

The frequency off-set may be implemented as illustrated in FIG. 7 in which like apparatus between FIGS. 1 and 7 carry like reference characters.

In this system a fixed oscillator 40 is phase shifted by 45° ($\pi/4$) and is applied to switch 34. Off-set oscillators 42, 44 and 46 are phase shifted respectively by 0°, 33.75° ($3\pi/16$) and 303.75° ($27\pi/16$) with the phase shifted outputs also being applied to switch 34.

In this case $\alpha$ for oscillator $42 = \frac{1}{4}$ $\alpha$ for oscillator $44 = \frac{1}{8}$ and $\alpha$ for oscillator $46 = \frac{3}{8}$. The switching between the delayed oscillator outputs with each clock pulse is as follows: In an alternate design only two offset oscillators need be used but this requires two more phase compensation delay lines.

Another alternate scheme can be devised after discovering that $\alpha$ can also be chosen so that the phase sample values over certain intervals of n will be $\pi$ out of phase with other values. In this case:

$$\alpha = (kl/N) - (1/l) - (2n/N)$$

If an inverter is used after the phase detector to provide the $\pi$ phase shift, oscillators and/or delay lines can be saved. The phase values for the sample rate increased by a factor of four using this scheme is in Table V.

TABLE V
SAMPLES OF FREQUENCY OFFSET LINEARLY SWEPT WAVEFORM $(l = 2)$ $\left\{ \theta_s = \pi\left(\frac{n^2}{16} + \alpha n\right) \right\}$  $\left( \alpha = \frac{k}{4} - \frac{1}{4} - \frac{n}{8} \right)$

| n | $\theta_s$ $\alpha = 0$ $n = 0$ | $\alpha = \frac{1}{8}$ $n = 1$ | $\alpha = 0$ $n = 2$ | $\alpha = \frac{1}{8}$ $n = 3$ |
|---|---|---|---|---|
| 0 | 0 | | | |
| 1 | | $3\pi/16$ | | |
| 2 | | | $\pi/4$ | |
| 3 | | | | $15\pi/16$ |
| 4 | $\pi$ | | | |
| 5 | | $3\pi/16$ | | |
| 6 | | | $\pi/4$ | |

TABLE V-continued
SAMPLES OF FREQUENCY OFFSET LINEARLY SWEPT WAVEFORM $(l = 2)$ $\left\{ \theta_s = \pi\left(\frac{n^2}{16} + \alpha n\right) \right\}$  $\left( \alpha = \frac{k}{4} - \frac{1}{4} - \frac{n}{8} \right)$

| n | $\theta_s$ $\alpha = 0$ $n = 0$ | $\alpha = \frac{1}{8}$ $n = 1$ | $\alpha = 0$ $n = 2$ | $\alpha = \frac{1}{8}$ $n = 3$ |
|---|---|---|---|---|
| 7 | | | | $31\pi/16$ |
| 8 | 0 | | | |
| 9 | | $3\pi/16$ | | |
| 10 | | | $\pi/4$ | |
| 11 | | | | $15\pi/16$ |
| 12 | $\pi$ | | | |
| 13 | | $3\pi/16$ | | |
| 14 | | | $\pi/4$ | |
| 15 | | | | $31\pi/16$ |

It will be appreciated that in the cases discussed thus far, the sample rate was increased by a factor of 4. In so doing, a unique set of repetitive phases 0°, 11.25°, 45°, 101.25°, 180°, 281.25°, 191.25° constitute a set of values unique to the four-fold sample rate increase. It will be appreciated that if the sample rate is to be increased by, for instance, a factor of 8, another unique set of repetitive phases will apply. In general, the sample rate can be increased by any factor such that "N" can be any integer. The $\sqrt{N}$ is the effective sample rate increase.

Although preferred embodiments of the invention have been described in considerable detail for illustrative purposes, many modifications will occur to those skilled in the art. It is therefore desired that the protection afforded by Letters Patent be limited only by the true scope of the appended claims.

What we claim is:

1. A method for increasing the sweep rate and/or providing a more linear sweep frequency of a frequency generator whose frequency changes linearly in time where the phase of the generator's output is sampled at regularly occurring sampling intervals during the sweep, and in which the output frequency of the generator is corrected in accordance with sampled information so as to effect a linear frequency sweep with time comprising the steps of:
  heterodyning the output of the frequency generator;
  introducing a phase shift in the heterodyned output of the frequency generator by predetermined amounts in a specific periodic manner in specific time periods during the sweep of the frequency generator so as to produce more zero axis crossings of the heterodyned output of the generator than would occur without said phase shifting, whereby the number of samples of the frequency generator output per unit time is increased, thereby causing an increase in the amount of sampled information which is used to linearize the sweep of the frequency generator.

2. A method for increasing the sweep rate and/or providing a more linear sweep of a linearly swept frequency generator, in which the phase of the output of said generator is sampled at regularly occurring sampling intervals during the sweep, and in which the output of the generator is altered in accordance with sampled information so as to effect a linear sweep comprising the steps of:

heterodyning the output of the frequency generator;
introducing a phase shift in the heterodyned output of the frequency generator by predetermined amounts in a specific periodic manner in specific time periods during the sweep of the frequency generator so as to produce more zero axis crossings of the heterodyned output of the generator than would naturally occur without said phase shifting, and
sampling the generator output signal at specific time periods during the sweep of the frequency generator when said zero axis crossings are expected to occur assuming an absolutely linear sweep, whereby the rate at which the frequency generator output is sampled is increased due to the introduction of the phase shifts, thereby permitting an increase in the sweep rate at which the frequency generator may be operated.

3. Apparatus for increasing the sweep rate and/or providing a more linear sweep of a linearly swept frequency generator, in which the phase of the output of said generator is sampled at regularly occurring sampling intervals during the sweep, and in which the output of the generator is altered in accordance with sampled information so as to effect a linear sweep, comprising:

means for heterodyning the output of the frequency generator;
means for introducing a phase shift in the heterodyned output of the frequency generator by predetermined amounts in a specific periodic manner in specific time periods during the sweep of the frequency generator so as to produce more zero axis crossings of the heterodyned output of the generator than would occur without said phase shifting, whereby the number of samples of the frequency generator output per unit time is increased, thereby causing an increase in the amount of sampled information which is used to linearize the sweep of the frequency generator.

4. The apparatus of claim 3 further including means for sampling heterodyned output of said generator at times when zero axis crossings are expected to occur assuming an absolutely linear sweep.

5. The apparatus of claim 3, wherein said phase shifting means includes a fixed frequency oscillator, means for delaying the output of said fixed frequency oscillator by predetermined amounts, and means for selecting among the various delayed outputs from said fixed frequency oscillator for heterodyning with the output of said linearly swept frequency generator.

6. The apparatus of claim 5 wherein said delaying means includes a minimum number of delay lines not to exceed N/2 where N is an even integer representing the number of samples or before sample values repeat.

7. The apparatus of claim 4 wherein said sampling means includes means for generating sampling pulses and means responsive to a sampling pulse for detecting deviations in phase of the output from said heterodyning means from a preselected value and for providing an error signal proportional to said deviation.

8. The apparatus of claim 7 wherein said error signal is coupled to said frequency generator for control thereof to increase linearity.

9. The apparatus of claim 3, wherein said heterodyning means comprises a mixer.

10. The apparatus of claim 1 wherein said delay lines are a minimum number not to exceed N/2 where N is an even integer representing the number of samples in a period of the specific periodic phase shifts.

11. The apparatus claimed in claim 3 wherein said means for introducing a phase shift comprises:

a fixed frequency oscillator;
at least one offset oscillator whose output is synchronized with said fixed oscillator so that the outputs of said fixed oscillator and said offset oscillator are in a predetermined phase relationship;
means for delaying the outputs of said fixed frequency and offset oscillators by predetermined amounts; and
means for selecting among the various delayed oscillator outputs for heterodyning with the output of said linearly swept frequency generator.

12. The apparatus claimed in claim 11 wherein said selecting means is a switch.

13. The apparatus claimed in claim 11 wherein said delay means is at least one delay line.

* * * * *